United States Patent
Tomkins

(10) Patent No.: US 10,024,153 B2
(45) Date of Patent: Jul. 17, 2018

(54) WIDE TEMPERATURE RANGE PEAK HOLD CIRCUIT

(71) Applicant: Sondex Wireline Limited, Yately, Hampshire (GB)

(72) Inventor: Kenneth Tomkins, Hampshire (GB)

(73) Assignee: Sondex Wireline Limited, Farnborough, Hampshire (GB)

( * ) Notice: Subject to any disclaimer, the term of this patent is extended or adjusted under 35 U.S.C. 154(b) by 55 days.

(21) Appl. No.: 15/104,610

(22) PCT Filed: Dec. 16, 2013

(86) PCT No.: PCT/IB2013/003205
§ 371 (c)(1),
(2) Date: Jun. 15, 2016

(87) PCT Pub. No.: WO2015/092474
PCT Pub. Date: Jun. 25, 2015

(65) Prior Publication Data
US 2017/0009565 A1    Jan. 12, 2017

(51) Int. Cl.
*E21B 47/00*    (2012.01)
*E21B 49/08*    (2006.01)
(Continued)

(52) U.S. Cl.
CPC .......... *E21B 47/011* (2013.01); *G01V 11/002* (2013.01); *G11C 27/024* (2013.01); *E21B 47/06* (2013.01); *E21B 47/065* (2013.01)

(58) Field of Classification Search
None
See application file for complete search history.

(56) References Cited

U.S. PATENT DOCUMENTS 3,862,437 A * 1/1975 Rossell ................. G01R 19/04
                                                                327/58
5,691,657 A * 11/1997 Hirano ................. G11C 27/026
                                                                327/94

(Continued)

FOREIGN PATENT DOCUMENTS

EP        1385174 A1    1/2004
WO    20090156887 A1    12/2009

OTHER PUBLICATIONS

International Search Report and Written Opinion issued in connection with corresponding PCT application PCT/IB2013/003205 dated Jun. 18, 2014.

*Primary Examiner* — Peter Macchiarolo
*Assistant Examiner* — Jermaine Jenkins
(74) *Attorney, Agent, or Firm* — GE Global Patent Operation

(57) ABSTRACT

A peak hold circuit configured for use in a downhole sensor includes a long tail pair circuit, a correction circuit, and a current mirror circuit. The current mirror circuit includes two current mirrors connected to a long tail pair formed by a first transistor and a second transistor. The current mirror also includes a first resistor and a second resistor connected to a third transistor. The first transistor is connected to a correction transistor of the correction circuit. The value of the first resistor is selected to be essentially equal to the same value as the second resistor so that when the long tail pair is balanced, the current flowing through a collector of the second transistor is equal to the current flowing through the first transistor, causing the correction transistor to switch off.

11 Claims, 4 Drawing Sheets

(51) Int. Cl.
*E21B 49/00* (2006.01)
*E21B 47/01* (2012.01)
*G11C 27/02* (2006.01)
*G01V 11/00* (2006.01)
*E21B 47/06* (2012.01)

(56) References Cited

U.S. PATENT DOCUMENTS 7,368,973 B2 * 5/2008 Sato .................. G01K 7/01
 327/512
8,179,166 B2 * 5/2012 Wang .................. G11C 27/026
 327/93
9,634,629 B2 * 4/2017 Watanabe ............ H03F 3/4521

* cited by examiner

WIDE TEMPERATURE RANGE PEAK HOLD CIRCUIT

BACKGROUND

Embodiments disclosed herein relate generally to the field of downhole measurement tool circuits, and more particularly, but not by way of limitation, to an improved downhole measurement tool peak hold circuit and method for reducing the effect of temperature on the circuit in high-temperature downhole logging applications.

Downhole tools are often used to collect data and measure downhole parameters in the wellbore. The data that is gathered through the use of these downhole tools can be used to detect problems that might occur due to adverse downhole conditions. In many instances, downhole tools are subjected to high-temperature, corrosive environments. The downhole tools must be able to operate to provide reliable data regarding the downhole environment to the surface regardless of the temperature of the downhole environment.

Downhole sensors often employ circuits that detect a condition (e.g., temperature, vibration, pressure) and output an analog signal representative of the measured condition. The analog output signal is then conditioned, sampled and processed. In many cases, the analog signal is converted to digital through a sampling process. Sample and hold circuits are used to measure peak voltage values, store the peak voltage value and output the peak voltage to downstream circuits. Peak hold circuits are well known in the art for performing this function.

Shown in FIG. 1 is an illustration of a PRIOR ART peak hold circuit 500. In the peak hold circuit 500, the input voltage 502 is connected to a base 504 of a first transistor 506. The emitter 508 of the first transistor 506 and the emitter 510 of a second transistor 512 are coupled together and then coupled to a low voltage source 514 via a first resistor 516 to form a long tail pair circuit. In the peak hold circuit 500, the collector 518 of the first transistor 506, the collector 520 of the second transistor 512 and the emitter 522 of a third transistor 524 are connected to a high voltage source 526. The value of a second resistor 528 is selected such that the current flowing through it is one half of the current flowing through the first resistor 516. This selection of the value of the second resistor 528 causes the third transistor 524 to switch off when the input voltage 502 is at a peak and the first transistor 506 and second transistor 512 are balanced. Switching off the third transistor 524 minimizes offset errors which may result due to imperfections present in the hold capacitor 530, the third transistor 524 and the output amplifier 532.

A rise in temperature does not significantly or differentially affect the long tail pair circuit formed by the first transistor 506 and the second transistor 512 because as temperature fluctuates both of these transistors are affected to the same degree. However, the third transistor 524 is still affected by temperature variations and only switches off when the first transistor 506 and the second transistor 512 are balanced at a particular temperature. This inability to operate at a variety of temperatures causes uncertainty in the output data measured by the circuit.

There is, therefore, a need for an improved downhole peak hold circuit and method that minimizes the offset error resulting from temperature changes in the downhole environment. It is to this and other deficiencies in the field that embodiments disclosed herein are directed.

SUMMARY

In an embodiment, the present invention includes a peak hold circuit (e.g., capable of operating at a wide temperature range). The peak hold circuit includes a long tail pair circuit, a correction circuit, and a current mirror circuit. The current mirror circuit includes two current mirrors connected to a long tail pair formed by a first transistor and a second transistor. The current mirror also includes a first resistor and a second resistor connected to a third transistor. The first transistor is connected to a correction transistor of the correction circuit.

Another aspect provides a method for reducing the effect of temperature on a peak hold circuit. The method includes the steps of providing a long tail pair formed by matching a first transistor and a second transistor and providing a hold circuit formed by connecting a collector of a correction transistor to an operational amplifier and a hold capacitor, and connecting an emitter of the correction transistor to a voltage source. The method continues by providing a current mirror circuit further including the steps of connecting the outputs of at least two current mirrors to a collector of the first transistor and a collector of the second transistor so that the current flowing in the long tail pair is equal to the sum of the currents flowing through a first resistor and a second resistor. The method further includes the step of selecting the value of the first resistor to be essentially equal to the value of the second resistor so that when the long tail pair is balanced, the current flowing through a collector of the second transistor is equal to the current flowing through the first transistor, causing the correction transistor to switch off.

DETAILED DESCRIPTION

Figure 1:
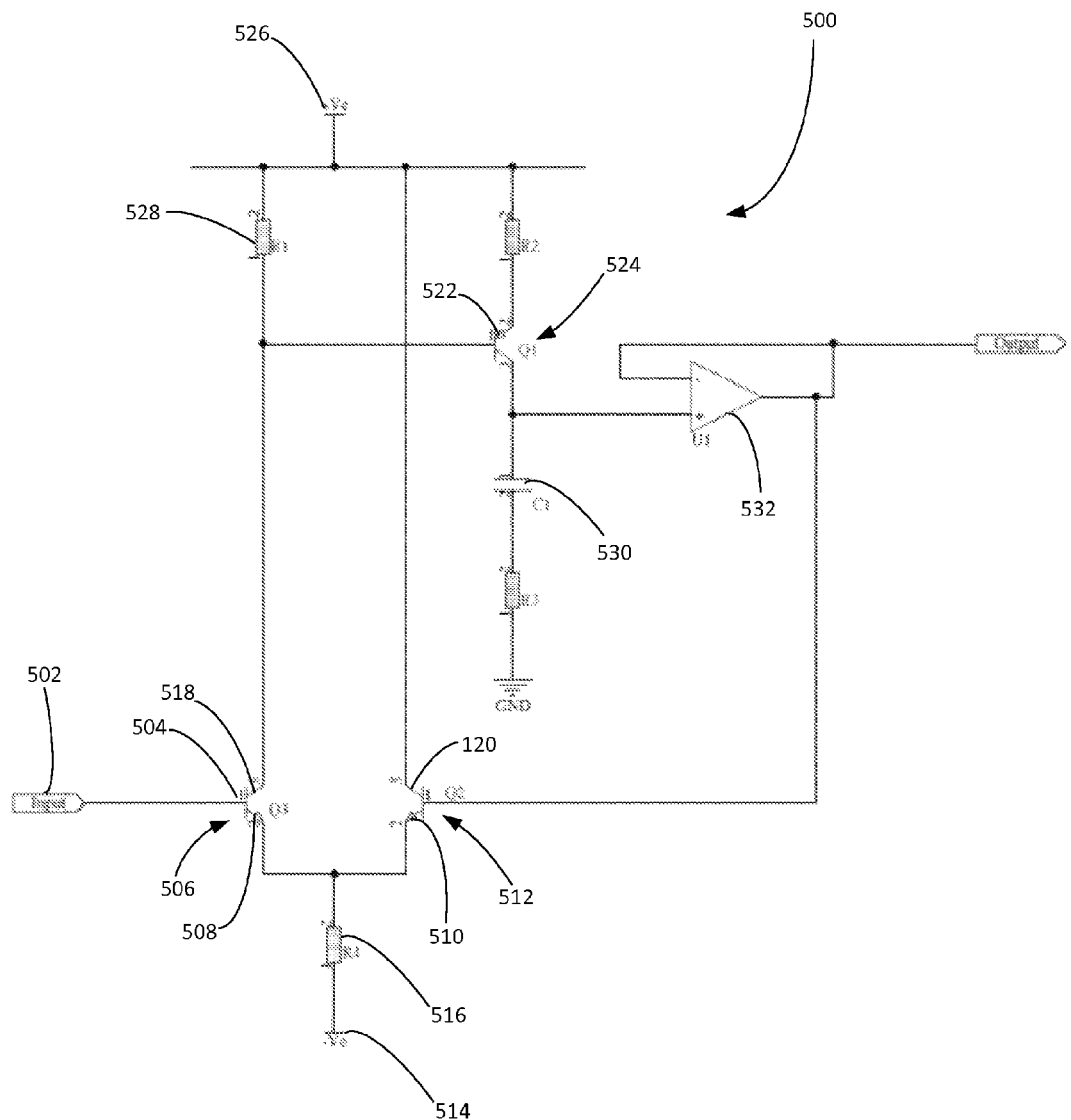
FIG. 1 is a circuit diagram illustrating an example of a PRIOR ART peak hold circuit.
Figure 2:
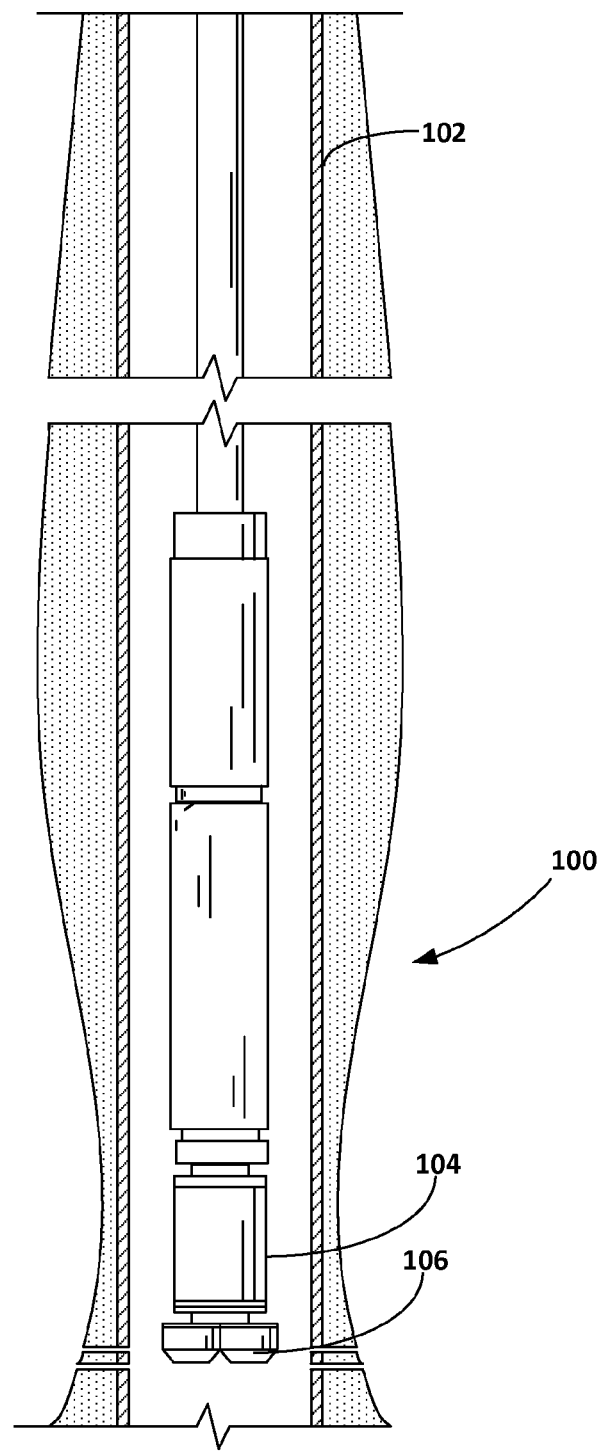
FIG. 2 is a depiction of a downhole tool and sensor module constructed in accordance with an embodiment.

In accordance with an embodiment, FIG. 2 depicts a downhole tool 100 disposed in a wellbore 102. The downhole tool 100 may be used in drilling, monitoring, pumping, treating, logging or other downhole operations. In an embodiment, the downhole tool 100 includes a sensor module 104 that includes one or more sensors 106. The sensors 106 may be used to measure and provide information about a number of different operational and environmental variables, including but not limited to motor operating temperature, wellbore intake pressure, wellbore temperature, gas content, liquid content, system vibration, current leakage, discharge temperature, flow rates, discharge pressure, and radioactivity.

Figure 3:
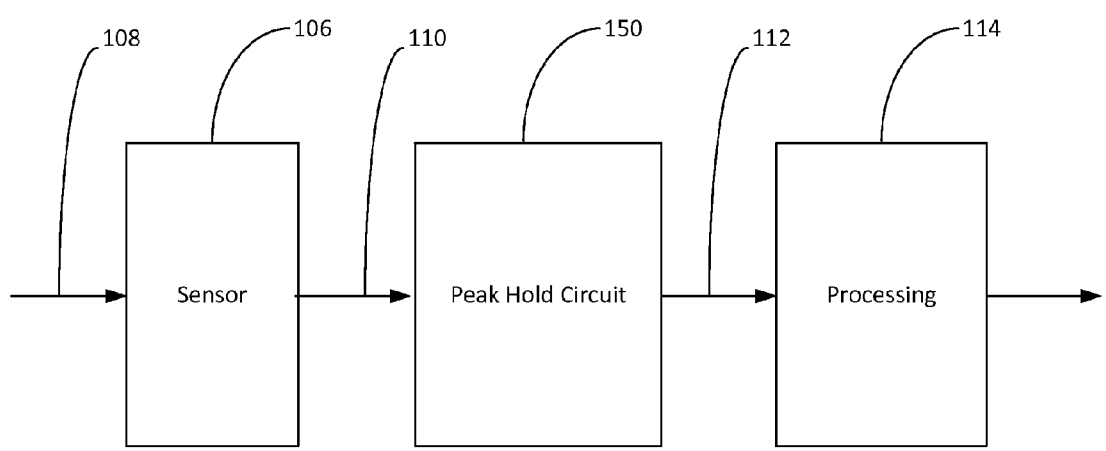
FIG. 3 is a functional diagram of the sensor module of FIG. 2.

Turning to FIG. 3, shown therein is a functional diagram of a process for taking measurements with the sensors 106. The sensors 106 receive input 108 from the wellbore 104 and the downhole tool 100 and output a measurement voltage 110. The measurement voltage 110 provides an analog representation of the environmental or operational condition evaluated by the sensor 106. The measurement voltage 110 is provided to a peak hold circuit 150. Generally, the peak hold circuit 150 is configured to provide a reliable output of peak voltage from the sensor that is largely independent of fluctuations in downhole temperatures. The peak hold circuit 150 provides a peak output voltage 112 to downstream processing modules 114. The downstream processing modules 114 can be used to condition, sample, digitize or transmit the peak output voltage 112. It will be appreciated that the sensors 106, peak hold circuit 150 and processing modules 114 may be included within the sensor module 104 or within separate components located on the downhole tool 100 or in surface-based facilities or equipment.

Figure 4:
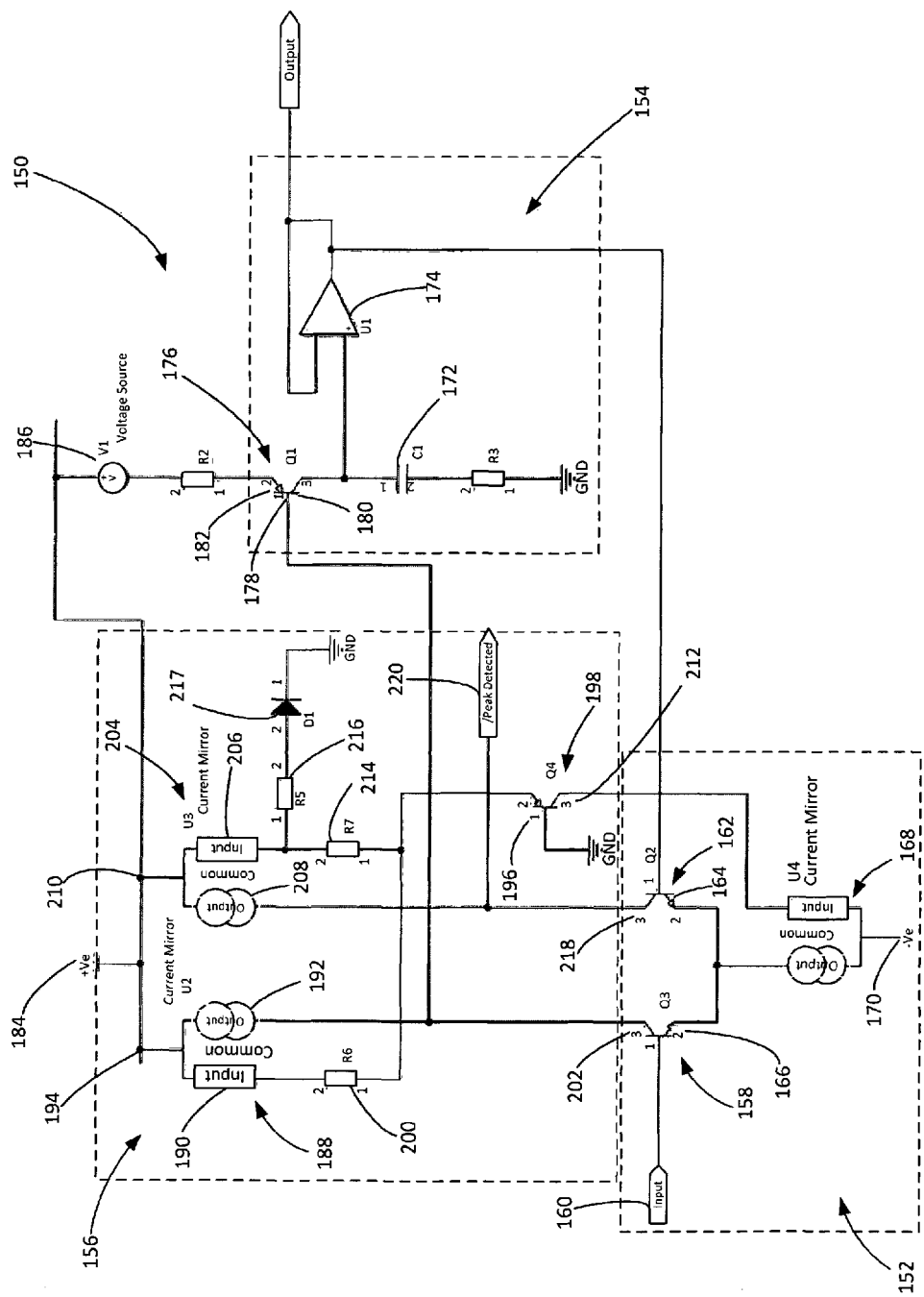
FIG. 4 is a circuit diagram illustrating an example of the wide temperature range peak hold circuit constructed in accordance with an embodiment.

Turning to FIG. 4, shown therein is an embodiment of the peak hold circuit 150.

The peak hold circuit 150 generally includes a long tail pair circuit 152, a correction circuit 154, and a current mirror circuit 156. The long tail pair circuit 152 includes a first transistor 158 provided with an input signal/voltage 160. A second transistor 162 includes a second emitter 164 which is coupled to a first emitter 166 of the first transistor 158. A first current mirror 168 is coupled to a low voltage source 170. It will be understood that the first current mirror 168 may consist of a resistor, an active current source, or any other suitable current source known in the art.

The correction circuit 154 includes a hold capacitor 172, capable of holding a hold voltage, an operational amplifier 174, which is supplied with the hold voltage, and a correction transistor 176. The correction transistor 176 includes a correction base 178, a correction collector 180 and a correction emitter 182. The correction collector 180 is coupled to the hold capacitor 172 and the operational amplifier 174, and the correction emitter 182 is coupled to a high voltage source 184. It will be understood that the correction emitter 182 may additionally be connected to a small voltage source 186.

The current mirror circuit 156 includes a second current source 188 forming a current mirror and including a second input 190, a second output 192, and a second common node 194. The second input 190 is coupled to a third emitter 196 of a third transistor 198 via a first resistor 200. The second output 192 is coupled to a first collector 202 of the first transistor 158, and the second common node 194 is coupled to the high voltage source 184. A third current source 204 forms a current mirror and includes a third input 206, a third output 208, and a third common node 210. The third input 206 of the third current source 204 is coupled to the third emitter 196 of the third transistor 198 via a second resistor 214. The third input 206 is also connected to ground via a third resistor 216 and diode 217. The third output 208 is connected to a second collector 218 of the second transistor 162. The third common node 210 is coupled to the high voltage source 184. The second output 192 of the second current source 188 and the first collector 202 of the first transistor 158 are coupled to the correction base 178 of the correction transistor 176. The third transistor 198 includes a third collector 212 that is connected to the first current mirror 168.

In the peak hold circuit 150, the current through the long tail pair formed by the first transistor 158 and the second transistor 162 is equal to the sum of the currents in the first resistor 200 and the second resistor 214. If the first resistor 200 and the second resistor 214 are selected to be of essentially equal value, then when the first transistor 158 is balanced with the second transistor 162, the current flowing in the second collector 218 is equal to the current flowing in the first resistor 200. This arrangement ensures that the correction transistor 176 operates independently from any temperature change and always switches off when the first transistor 158 is balanced with the second transistor 162.

The third resistor 216 provides additional current to flow into the third current source 204. This additional current ensures that the peak detected output 220 is inactive before a peak value occurs when the first transistor 158 is balanced with the second transistor 162. The value selected for the third resistor 216 determines how much voltage drop occurs from the peak value before the peak detected output 220 becomes active.

If a small voltage source 186 is connected to the correction emitter 182 of the correction transistor 176 the voltage provided ensures that the correction emitter 182 of the correction transistor 176 is kept at a potential below the saturation of the second current source 188 so that the correction transistor 176 will switch off even at elevated temperatures.

The peak hold circuit 150 reduces the effect of temperatures on the offset error found in most peak hold circuits. This reduction reduces the uncertainty in the interpretation of the data produced by the circuit. In addition, the peak hold circuit 150 is easy to implement using dual transistors for the first transistor 158 and the second transistor 162 for matching. The current balance present in an embodiment relies on tracking the first resistor 200 and the second resistor 214 and ensuring that the current mirrors formed by the second current source 188 and the third current source 204 are operating correctly. The peak hold circuit 150 also requires less PCB (Printed Circuit Board) area than alternative designs known in the art.

It is to be understood that even though numerous characteristics and advantages of various embodiments have been set forth in the foregoing description, together with details of the structure and functions of various embodiments, this disclosure is illustrative only, and changes may be made in detail, especially in matters of structure and arrangement of parts within the principles of the embodiments to the full extent indicated by the broad general meaning of the terms in which the appended claims are expressed. It will be appreciated by those skilled in the art that the teachings disclosed herein can be applied to other systems without departing from the scope and spirit of the application.

What is claimed is:

1. A peak hold circuit comprising:
   a long tail pair circuit comprising:
      a first transistor provided with an input signal;
      a second transistor, wherein a second emitter of the second transistor is coupled to a first emitter of the first transistor; and
      a first current source coupled to a low voltage source;
   a correction circuit comprising:
      a hold capacitor which holds a hold voltage;
      an operational amplifier supplied with the hold voltage; and
      a correction transistor comprising a correction base, a correction collector and a correction emitter, wherein the correction collector is coupled to the hold capacitor and the operational amplifier, and the correction emitter is coupled to a high voltage source;
   a current mirror circuit comprising:
      a second current source comprising a second input, a second output, and a second common node, wherein the second input is coupled to a third emitter of a third transistor via a first resistor, the second output is coupled to a first collector of the first transistor, and the second common node is coupled to the high voltage source; and
      a third current source comprising a third input, a third output, and a third common node, wherein the third input is coupled to a third emitter of the third transistor via a second resistor and to ground via a third resistor, and the third output is coupled to a second collector of the second transistor, and the third common node is coupled to the high voltage source;

wherein the second output of the second current source and the first collector of the first transistor are coupled to the correction base of the correction transistor.

2. The peak hold circuit of claim 1, wherein the correction emitter of the correction transistor is coupled to a small voltage source via a fourth resistor.

3. The peak hold circuit of claim 1, wherein the first current source is a first current mirror, wherein the first current mirror further comprises: a first input, a first output, and a first common node, wherein the first input is coupled to the collector of the third transistor, the first output is coupled to the emitter of each of the first and second transistors, and the first common node is connected to the low voltage source.

4. The peak hold circuit of claim 3, wherein the first input of the first current source is coupled to a fourth collector of a fourth transistor, and a fourth emitter of the fourth transistor is connected to the second input of the second current source via the first resistor and the third input of the third current source via the second resistor.

5. A method of reducing an offset error produced by a peak hold circuit as a result of temperature changes comprising the steps of:

providing a long tail pair formed by matching a first transistor and a second transistor;

providing a hold circuit formed by connecting a collector of a correction transistor to an operational amplifier and a hold capacitor, and connecting an emitter of the correction transistor to a high voltage source;

providing a current mirror circuit by connecting the outputs of at least two current mirrors to a collector of the first transistor and a collector of the second transistor so that the current flowing in the long tail pair is equal to the sum of the currents flowing through a first resistor and a second resistor; and selecting the value of the first resistor to be essentially equal to the value of the second resistor so that when the long tail pair is balanced, the current flowing through a collector of the second transistor is equal to the current flowing through the first transistor, causing the correction transistor to switch off.

6. The method of claim 5 further comprising the step of connecting the correction emitter of the correction transistor to a small voltage source via a fourth resistor.

7. The method of claim 5 further comprising the steps of:

connecting a third resistor to an input of the current mirror circuit to provide additional current into a current mirror of the current mirror circuit; and selecting a value for the third resistor to determine a particular voltage drop to ensure that a peak detected output is inactive before a peak value occurs when the first transistor is balanced with the second transistor.

8. A sensor configured to measure a downhole condition and output a signal representative of the measured downhole condition, the sensor comprising:

a peak hold circuit, wherein the peak hold circuit comprises:

a long tail pair comprising:

a first transistor provided with an input signal;

a second transistor, wherein a second emitter of the second transistor is coupled to a first emitter of the first transistor; and a first current source coupled to a low voltage source;

a correction circuit comprising:

a hold capacitor which holds a hold voltage;

an operational amplifier supplied with the hold voltage; and a correction transistor comprising a correction base, a correction collector and a correction emitter, wherein the correction collector is coupled to the hold capacitor and the operational amplifier, and the correction emitter is coupled to a high voltage source; and a current mirror circuit comprising:

a second current source comprising a second input, a second output, and a second common node, wherein the second input is coupled to a third emitter of a third transistor via a first resistor, the second output is coupled to a first collector of the first transistor, and the second common node is coupled to the high voltage source; and a third current source comprising a third input, a third output, and a third common node, wherein the third input is coupled to a third emitter of the third transistor via a second resistor and to ground via a third resistor, and the third output is coupled to a second collector of the second transistor, and the third common node is coupled to the high voltage source;

wherein the second output of the second current source and the first collector of the first transistor are coupled to the correction base of the correction transistor.

9. The sensor of claim 8, wherein the correction emitter of the correction transistor is coupled to a small voltage source via a fourth resistor.

10. The sensor of claim 9, wherein the first current source is a first current mirror, wherein the first current mirror further comprises: a first input, a first output, and a first common node, wherein the first input is coupled to the collector of the third transistor, the first output is coupled to the emitter of each of the first and second transistors, and the first common node is connected to the low voltage source.

11. The sensor of claim 10, wherein the first input of the first current source is coupled to a fourth collector of a fourth transistor, and a fourth emitter of the fourth transistor is connected to the second input of the second current source via the first resistor and the third input of the third current source via the second resistor.

* * * * *